(12) United States Patent
Liu et al.

(10) Patent No.: US 8,482,316 B1
(45) Date of Patent: Jul. 9, 2013

(54) ADAPTIVE TIMING CONTROL CIRCUITRY TO ADDRESS LEAKAGE

(75) Inventors: Zhen Wu Liu, Sunnyvale, CA (US);
Shree Kant, Union City, CA (US);
Heechoul Park, San Jose, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 13/411,493

(22) Filed: Mar. 2, 2012

(51) Int. Cl.
*H03K 19/0944* (2006.01)

(52) U.S. Cl.
USPC ............. 326/121; 326/95; 327/261; 327/161

(58) Field of Classification Search
USPC ...... 326/121, 95–98, 112, 119, 122; 327/261, 327/108, 141, 161
See application file for complete search history.

(56) References Cited

U.S. PATENT DOCUMENTS

| | | | |
|---|---|---|---|
| 7,256,621 B2 | 8/2007 | Lih et al. | 326/121 |
| 7,417,469 B2 * | 8/2008 | Cheng et al. | 326/112 |
| 7,977,977 B1 * | 7/2011 | Natarajan et al. | 326/98 |
| 2006/0132210 A1 * | 6/2006 | Kong et al. | 327/261 |

* cited by examiner

*Primary Examiner* — Daniel D Chang
(74) *Attorney, Agent, or Firm* — Martine Penilla Group, LLP

(57) ABSTRACT

Circuits, methods, and systems are presented for managing current leakage in an electronic circuit. One circuit includes a keeper circuit, and a controller. The keeper circuit supplies current to a leaker circuit, which is experiencing current leakage, to compensate for the current leakage. Further, the controller provides to the keeper circuit a control signal that is based on the current leakage. The control signal has a cycle equal to the cycle of a clock signal, and the control signal is a pulse having a first value during a first period, and a second value during a second period of the pulse. The keeper circuit provides a current to the leaker circuit during the first period and the keeper circuit withholds the current to the leaker circuit during the second period, where the durations of the first period and the second period are based on the current leakage.

17 Claims, 7 Drawing Sheets

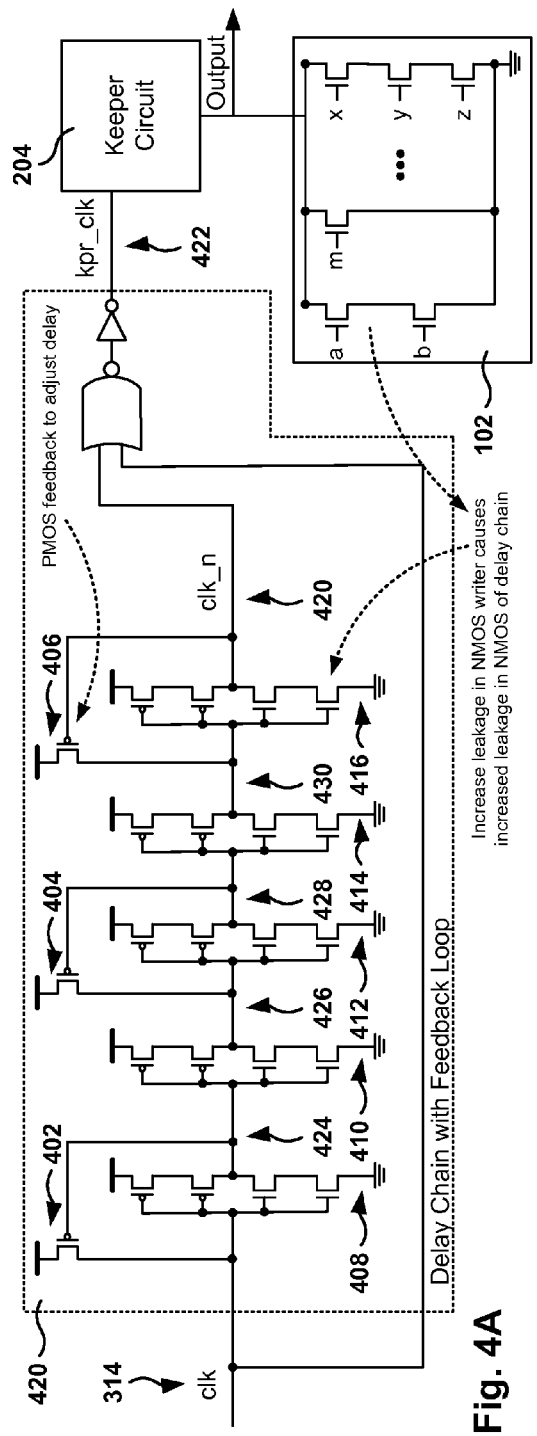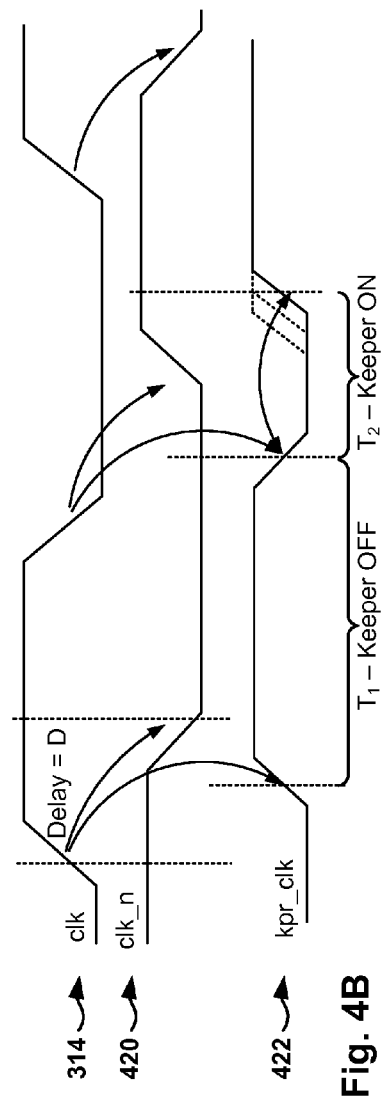
Fig. 4A
Fig. 4B

ADAPTIVE TIMING CONTROL CIRCUITRY TO ADDRESS LEAKAGE

BACKGROUND

1. Field of the Invention

The present embodiments relate to electronic circuits for managing power consumption, and more particularly, methods and circuits for managing power consumption utilizing keeper circuits.

2. Description of the Related Art

Many electronic circuits are regulated by a clock signal with two different cycles. Typically, a pre-charge cycle is used to load values in registers of the electric circuit, and an evaluation cycle is used to read these values. In the pre-charge cycle, power is provided to the electric circuit to charge electronic components that may hold one or more binary values. In the evaluation cycle, an output is obtained from the electronic circuit based on the stored values during the pre-charge cycle.

During the evaluation cycle, current leakage may take place as the transistors in the electronic circuit may leak current. If the leakage is too high, there is a possibility of an erroneous read of the loaded values. A keeper circuit is incorporated to solve this problem. The keeper circuit provides current to the electronic circuit during the evaluation cycle in order to compensate for the leakage in the electronic circuit.

Some existing solutions for leaker circuits provide a fixed amount of current from the leaker circuit, without consideration to the amount of leakage actually suffered by the electronic circuit. This may cause unnecessary power consumption in the electronic circuit.

It is in this context that embodiments arise.

SUMMARY

Embodiments of the disclosure provide circuits, methods, and systems for managing current leakage in an electronic circuit. It should be appreciated that the present embodiments can be implemented in numerous ways, such as a process, an apparatus, a system, a device or a method on a computer readable medium. Several embodiments are described below.

In one embodiment, a circuit includes a keeper circuit, and a controller. The keeper circuit supplies current to a leaker circuit, which is experiencing current leakage, to compensate for the current leakage in the leaker circuit. Further, the controller provides to the keeper circuit a control signal that is based on the current leakage. The control signal has a cycle equal to the cycle of a clock signal, and the control signal is a pulse having a first value during a first period, and a second value during a second period of the pulse. The keeper circuit provides a current to the leaker circuit during the first period and the keeper circuit withholds the current to the leaker circuit during the second period, where the durations of the first period and the second period are based on the current leakage.

In another embodiment, a circuit includes a first circuit and a second circuit. The first circuit is operable to supply current to a leaker circuit to compensate for a first current leakage in first NMOS transistors in the leaker circuit. The second circuit is coupled to the first circuit and is operable to generate a control signal to the first circuit, to compensate for the first current leakage. In addition, the second circuit includes second NMOS transistors and one or more second PMOS transistors. An increase of the first current leakage through the first NMOS transistors causes an increase in a second current leakage through the second NMOS transistors, and the one or more second PMOS transistors are operable to compensate for an increase in the second current leakage. Further, the control signal is a pulse that has a first value during a first period and a second value during a second period within the pulse. The first circuit provides a current to the leaker circuit during the first period and the first circuit withholds the current to the leaker circuit during the second period, where the one or more PMOS transistors are operable to determine the duration of the second period based on the second current leakage.

In yet another embodiment, a method for controlling circuit leakage is presented. The method includes an operation for operating a leaker circuit that has current leakage during the operating. In addition, the method includes another operation for generating, by a control circuit, a control signal for a keeper circuit that supplies current to the leaker circuit. The control signal is a pulse having a first period during which the keeper circuit provides a current to the leaker circuit and a second period during which the keeper circuit withholds the current to the leaker circuit. Durations of the first period and the second period are based on the current leakage. The control signal is then input to the keeper circuit.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 4A illustrates a controller that generates a control signal responsive to the current leakage in the leaker circuit, according to one embodiment.

FIG. 4B illustrates the shapes of the different signals associated with the circuit of FIG. 4A, according to one embodiment.

DETAILED DESCRIPTION

The following embodiments describe circuits, methods, and systems for managing current leakage in an electronic circuit. Embodiments provide solutions to address leakage by providing a timing control circuitry that adjusts the timing for which a keeper circuit is ON or OFF based on design needs and the manufacturing process needs. This level of design control and risk management helps to reduce the design-to-production cycle.

It will be apparent, that the present embodiments may be practiced without some or all of these specific details. In other instances, well known process operations have not been described in detail in order not to unnecessarily obscure the present embodiments.

Figure 1:
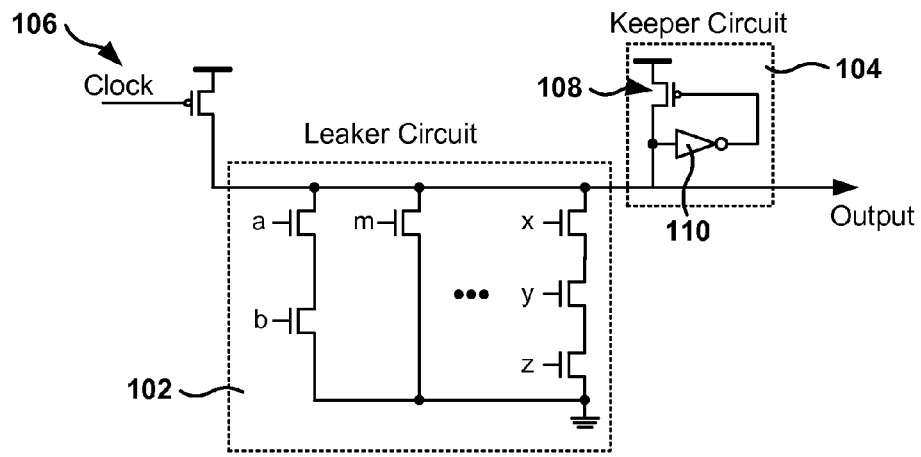
FIG. 1 is an exemplary circuit that includes a keeper circuit to provide current to a circuit experimenting current leakage, according to one embodiment.

FIG. 1 is an exemplary circuit that includes a keeper circuit to provide current to a circuit experimenting current leakage, according to one embodiment. FIG. 1 includes an electronic circuit that stores logical values, which it is referred to herein as a leaker circuit 102 because it leaks current during the reading operation of the stored logical values. The leaker circuit may also be referred to herein as register, gate, memory, writer, NMOS writer, etc., and the leaker circuit refers to any electronic circuit that may store logical values in electronic components and that may discharge undesirably during the operation of the circuit.

A keeper circuit 104 provides current to the leaker circuit in order to compensate for the current leaked through the electronic components of the leaker circuit (e.g., transistors). The keeper circuit 108 of FIG. 1 includes an inverter gate 110 with an input coupled to the output of the electronic circuit and an output coupled to the gate of a PMOS charging transistor 108. The PMOS charging transistor 108 provides current when the output of the inverter 110 is a low logical value.

Clock 106 is coupled to the leaker circuit 102 and to the keeper circuit 108, and clock 106 provides a pulsed signal with two cycles, such that values are stored in the leaker circuit 102 during the first cycle (pre-charge) of the clock signal, and values are read from the leaker circuit 102 in the second cycle (evaluation).

During the evaluation period, transistors in the leaker circuit 102 may discharge, which may cause false readings. During normal operation of the circuit, a large reading window is required to accommodate for changes in the process, as the process may move in any direction. For example, if the process becomes faster (e.g. NMOS is fast) a higher leakage will result, and the if the process becomes slower (e.g. NMOS is slow), then there will be less leakage, allowing for a larger reading window.

However, the larger the reading window is, the bigger the risk of a false reading due to a process shift. Embodiments described herein adjust the current provided by the keeper circuit 104 based on the actual leakage suffered by leaker circuit 102. Consequently, the risk of having a false read is decreased.

Figure 2:
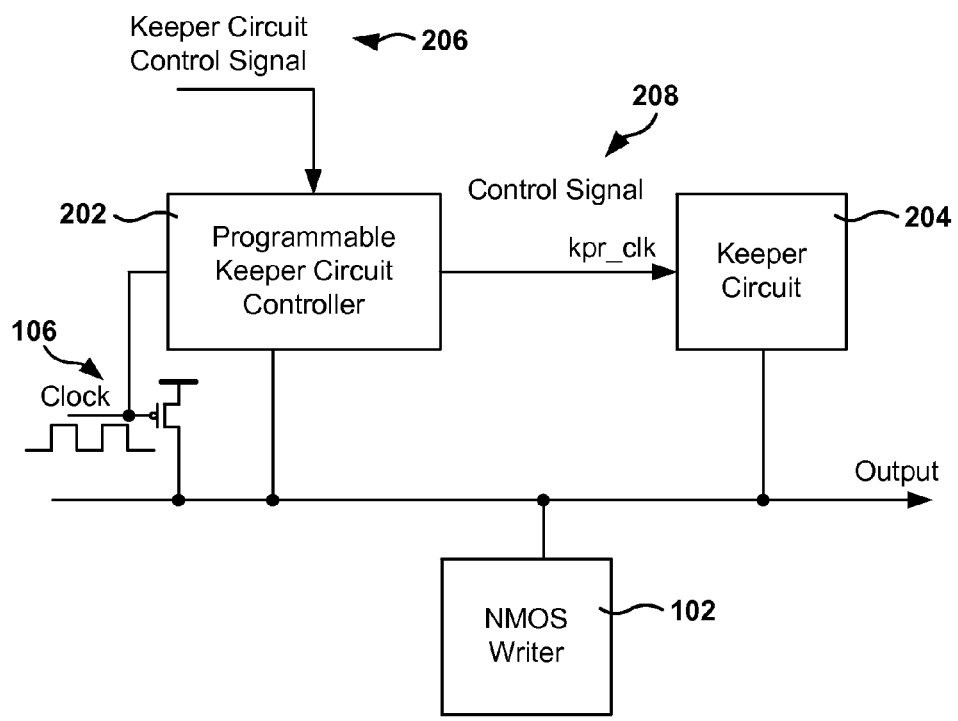
FIG. 2 is a block diagram for a circuit that has a controller for managing the operation of the keeper circuit, according to one embodiment.

FIG. 2 is a block diagram for a circuit that has a controller for managing the operation of the keeper circuit, according to one embodiment. Programmable keeper circuit controller 202 provides keeper circuit 204 a control signal kpr_ckl 208 that is operable to turn ON or OFF the keeper circuit, i.e., to turn ON or OFF the current provided to the NMOS writer circuit 102 (leaker circuit).

In one embodiment, the programmable keeper circuit controller 202 is configurable via keeper circuit control signal 206. For example, the keeper circuit control signal 206 may select how many delay gates to be used in the generation of a pulse that is a factor in determining the duration of the shut-off period of the keeper circuit. For more details see below the description with reference to FIGS. 4A, 5 and 6. The clock signal 106 is utilized to determine the timing of the pre-charge and evaluation periods.

Figures 3A, 3B:
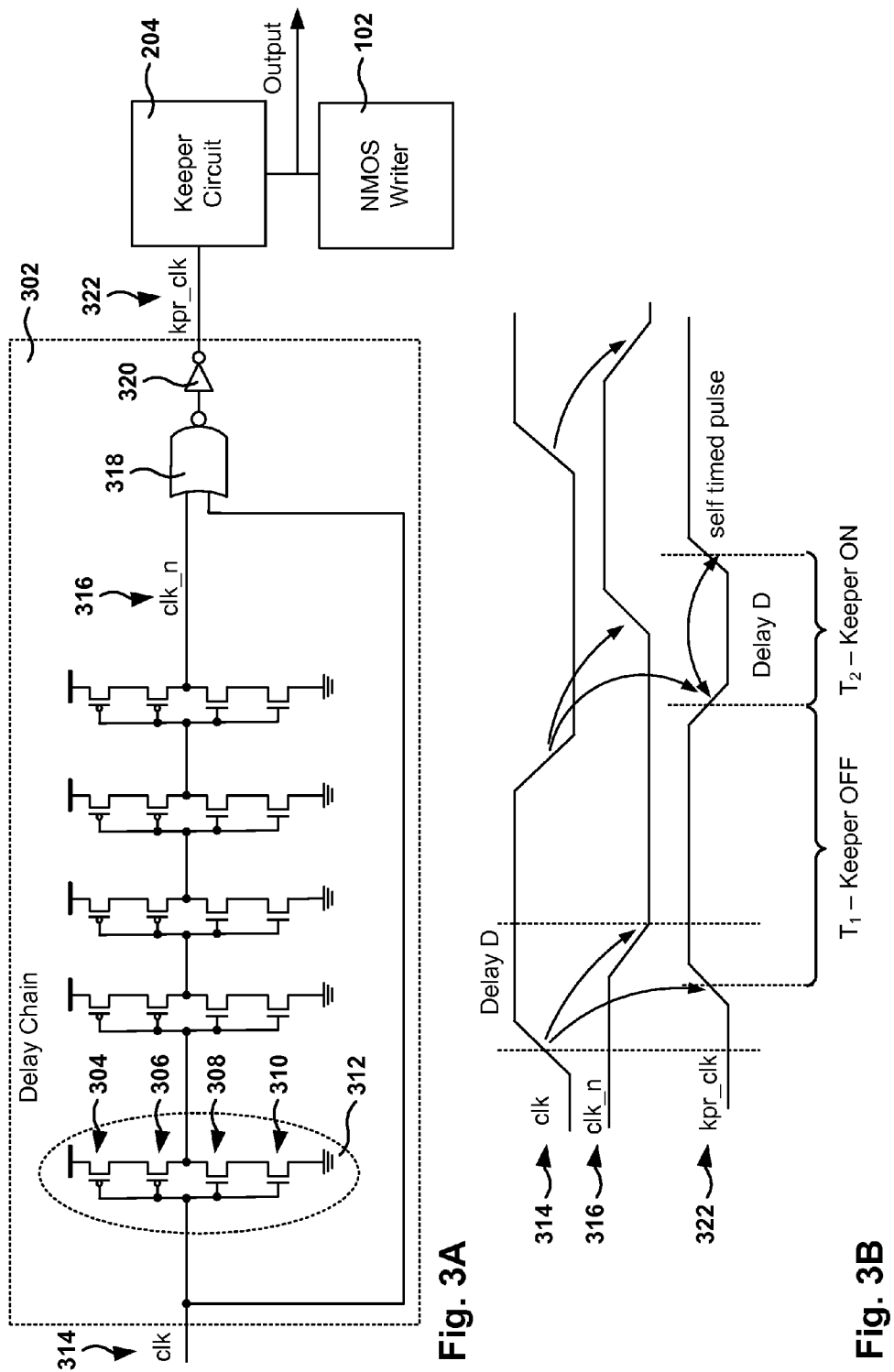
FIG. 3A illustrates a controller having a delay chain to generate a pulsed control signal, according to one embodiment.
FIG. 3B illustrates the shapes of the different signals associated with the circuit of FIG. 3A, according to one embodiment.

FIG. 3A illustrates a controller having a delay chain to generate a pulsed control signal, according to one embodiment. Embodiments present a programmable solution for the control of the keeper circuit. Instead of having the keeper circuit always ON (i.e., generating current for the leaker circuit), the pulsed signal kpr_ckl turns off the keeper circuit for a window of time during the evaluation period.

However, if the shutdown window is too wide (i.e., the keeper circuit is shut off too long), there is a risk that a leaky NMOS writer circuit will produce a false reading due to excessive leakage. On the other hand, if the shutdown window is narrower than necessary, the circuit will consume excess power. Therefore, if the leakage is relatively high a small shutdown window is desired, and if the leakage is relatively low a wider shutdown window is desired. Embodiments generate shutdown periods whose duration is based on the amount of leakage in the leaker circuit.

In the embodiment of FIG. 3A, a controller 302 receives clock signal 314 ckl as an input and generates control signal 322 kpr_ckl for the keeper circuit 204. The control signal 322 kpr_ckl is a pulsed signal, as described below in more detail with reference to FIG. 3B.

Controller 302 includes five inverters 312 (i.e., delay gates) connected serially, where the first inverter 312 has the clock signal 314 as an input and the last inverter has signal 316 ckl_n as an output, which has the same cycle as ckl signal 314, but with an inversion of the logical value and the insertion of an additional delay introduced by the delay gates. Each delay gate 312 includes two PMOS transistors 304 and 306 and two NMOS transistors 308 and 310, although a different number of transistors is also possible.

A logical NOR gate 318 performs a logical NOR operation between the clock ckl 314 and the delayed signal ckl_n 316, and inverter 320 inverts the output of the NOR gate 318 to generate the pulsed control signal kpr_ckl. In one embodiment, the keeper circuit 204 includes a PMOS transistor whose gate receives the kpr_ckl signal. The PMOS transistor is utilized to shut off the current to the leaker circuit. For more details see the description below with reference to FIG. 6.

FIG. 3B illustrates the shapes of the different signals associated with the circuit of FIG. 3A, according to one embodiment. The clock signal ckl 314 oscillates between a logical value of 1 and a logical value of 0, i.e., between a high voltage value and a low voltage value.

The ckl_n signal 316 is derived from the ckl signal 314 as the ckl signal is inverted and delayed by the delay D introduced by the delay chain of FIG. 3A. The keeper control signal 322 kpr_ckl is a pulsed derived from the combination of ckl and ckl_n, as described above. The keeper control signal 322 kpr_ckl is a pulsed signal with a first period $T_1$ with a high voltage value and a second period $T_2$ with a low voltage value.

During $T_1$ the keeper circuit is turned OFF, which means that current is not provided (i.e., the current is withheld) to the leaker circuit (e.g., NMOS writer 102). During $T_2$ the keeper circuit is turned ON, which means that current is provided to the leaker circuit during period $T_2$.

When the NMOS Writer 102 leaks more (i.e., the process of the NMOS transistors is stronger) the NMOS transistors in the delay chain also become stronger, causing the pulse (i.e., $T_2$) to shrink and the keeper circuit to be turned ON for a smaller amount of time. What is desired is that when the NMOS Writer 102 leaks more, the delay should increase in order to have the keeper circuit provide current for a longer period.

On the other hand, if the NMOS Writer 102 leaks less (i.e., the process of the NMOS transistors is weaker) the NMOS transistors in the delay chain also become weaker, causing the pulse (i.e., $T_2$) to become longer and the keeper circuit to be turned ON for a larger period of time, when the keeper circuit should be ON for a smaller period of time.

It is noted that the embodiments illustrated in FIGS. 3A and 3B are exemplary. Other embodiments may utilize different number of delay gates, different circuits, different types of transistors, etc. The embodiments illustrated in FIGS. 3A and 3B should therefore not be interpreted to be exclusive or limiting, but rather exemplary or illustrative.

FIG. 4A illustrates a controller that generates a control signal responsive to the current leakage in the leaker circuit, according to one embodiment. The controller 420 adds three PMOS transistors 402, 404, and 406, to the controller 302 of FIG. 3A. The PMOS transistors are in feedback mode within the delay chain to regulate the delay introduced by the delay chain based on the process leakage of the circuit.

To compensate for an increase or decrease in the current leakage, there is a PMOS feedback to adjust the delay in the delay chain, so the keeper circuit is turned ON for a longer or shorter period of time, based on the leakage. When the leakage is stronger, the PMOS feedback will adjust the window. The introduction of the PMOS transistors 402, 404, and 406 in feedback mode within the delay chain causes the delay, introduced by the delay chain, to vary according the amount of leakage in the circuit, as discussed below in detail with reference to FIG. 4B. The amount of time the keeper is OFF depends on how leaky the process is.

This embodiment provides the advantage and flexibility required to meet the design needs of a given dynamic circuitry to operate at different voltages and speeds. In addition, the embodiment provides independent control and flexibility to address leakage and writebility as need arises during the design cycle and during process maturity. This level of design control and risk management helps reduce the design-to-production cycle.

FIG. 4B illustrates the shapes of the different signals associated with the circuit of FIG. 4A, according to one embodiment. As discussed above, when the NMOS writer circuit 102 becomes stronger, it leaks more. Therefore, the delay D needs to increase to provide extra time for the keeper circuit to support extra leakage.

When clock signal ckl 314 is low, then PMOS transistors 402, 404, and 406 are ON. When the clock signal ckl 314 goes low, node 424 goes high, node 426 goes low, node 428 goes high, and node 430 goes low.

Usually, when NMOS is faster it leaks more. If it leaks more, the floating window must be narrow so the keeper circuit is ON longer. When the NMOS process becomes stronger, the falling delay thru inverters 410 and 414 will be faster but PMOS transistors 404 and 406 will also oppose the falling edge faster on nodes 426 and 430, not letting the overall delay D shrink to provide for extra current leakage.

Similarly if the NMOS process is weaker, the delay through inverters 410 and 414 will be slower and opposition by PMOS 404 and 406 will be weaker to let the pulse of kpr_ckl 422 shrink.

As a result, there is a feedback mechanism where the keeper circuit is turned ON (kpr_ckl going low) by the falling edge of the clock and automatically shuts off (kpr_ckl going high) by the self-timed pulse with Delay D based on the delay chain control circuitry.

It is noted that the principles presented herein to adjust the delay D to address the leakage needs are also applicable to devices with weak P, weak N; strong P, strong N; weak P, strong N; and strong P, weak N.

It is noted that the embodiments illustrated in FIGS. 4A and 4B are exemplary. Other embodiments may utilize different circuits, different number of feedback transistors, etc. Other embodiments where the shut-off window tracks the process of the electronic circuit are also possible, as long as the shut-off window adjusts to the leakage in the circuit. The embodiments illustrated in FIGS. 4A and 4B should therefore not be interpreted to be exclusive or limiting, but rather exemplary or illustrative.

Figure 5:
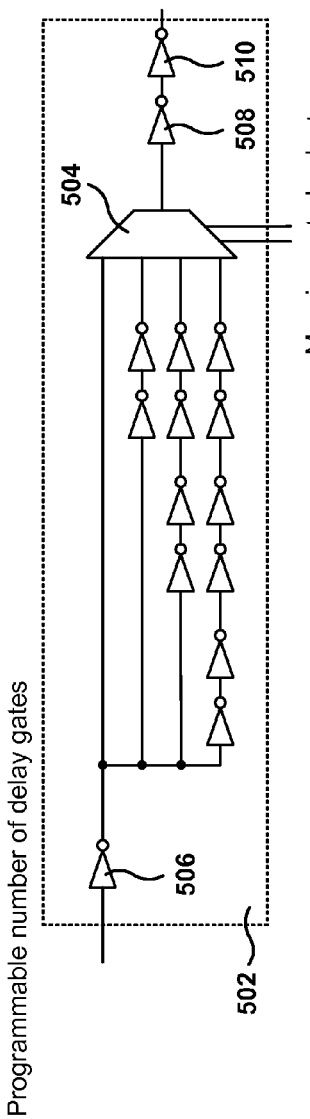
FIG. 5 illustrates a circuit for a controller with a selectable number of delay gates, in accordance with one embodiment.

FIG. 5 illustrates a circuit for a controller with a selectable number of delay gates, in accordance with one embodiment. A programmable delay module 502 includes multiplexer 504 that that has two binary inputs in order to select a different number of delay gates. In the embodiment of FIG. 5, there is a first inverter that is serially connected to four different lines coupled to multiplexer 504.

In addition, there are two inverters 508 and 510 coupled serially to the output of the multiplexer 504. As a result, according to margin control select signals for the multiplexer 504, the programmable delay module may include three, five, seven, or nine inverters. The number of gates selected for the delay chain affects the amount of delay introduced in the pulse of FIG. 4B.

By using the multiplexer, it is possible to provide a first parameter to configure the size of the window in which the keeper circuit is turned ON. As discussed above, the second parameter defining the size of the window is the actual leakage in the leaker circuit.

It is noted that the embodiment illustrated in FIG. 5 is exemplary. Other embodiments may utilize different number of delay gates, a different number of options, additional multiplexers, etc. The embodiment illustrated in FIG. 5 should therefore not be interpreted to be exclusive or limiting, but rather exemplary or illustrative.

Figure 6:
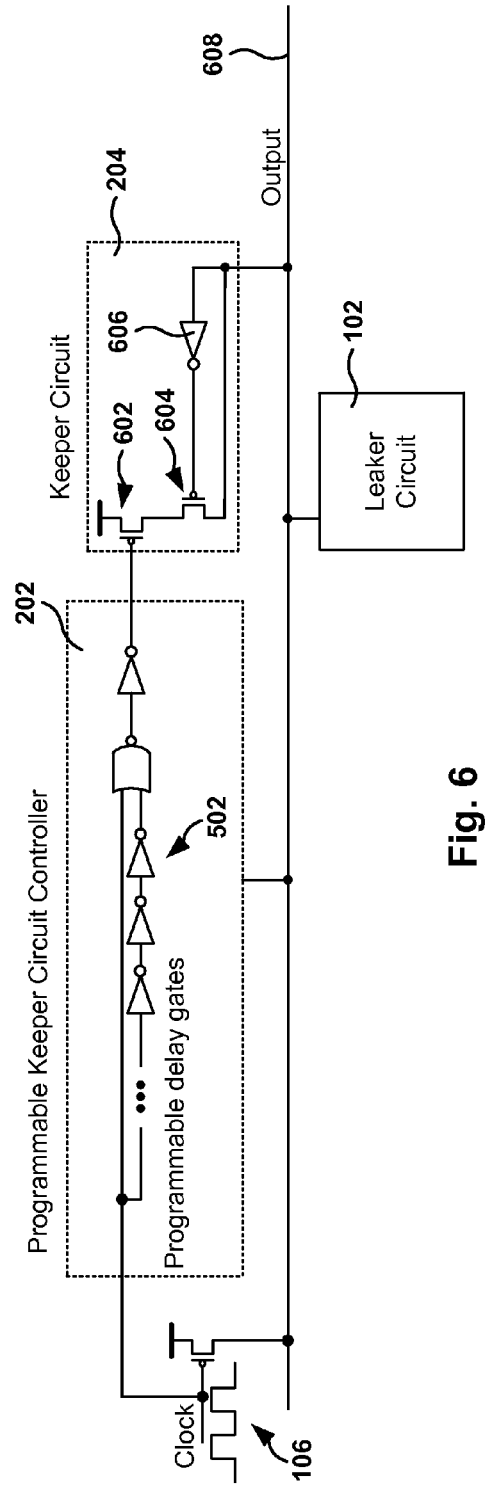
FIG. 6 is an electronic circuit with a keeper circuit that is disconnected from the leaker circuit for a period of time, according to one embodiment.

FIG. 6 is a circuit with a keeper circuit that is disconnected from the leaker circuit for a period of time, according to one embodiment. The programmable keeper circuit controller 202 includes a plurality of programmable delay gates, which can be configured by the circuit designer in order to make the shut-down window for the keeper circuit 204 bigger or smaller.

The control signal generated by the programmable keeper circuit controller 202 is an input for the keeper circuit 204. The control signal is coupled to PMOS transistor 602, which causes the disconnect of the current supplied from the power supply when the control signal is high, as described above with reference to FIG. 4B.

The keeper circuit 204 further includes PMOS transistor 604 and inverter 606. When the output 608 of the circuit is high, the output of inverter 606 will be low, and PMOS transistor 604 will provide current originating at the power supply to the leaker circuit, unless the keeper circuit has been shut-down by the control signal input to PMOS transistors 602.

It is noted that the embodiments illustrated in FIG. 6 are exemplary. Other embodiments may utilize different a different number of transistors in the keeper circuit, a different number of delay gates in the controller 202, etc. The embodiments illustrated in FIG. 6 should therefore not be interpreted to be exclusive or limiting, but rather exemplary or illustrative.

Figure 7:
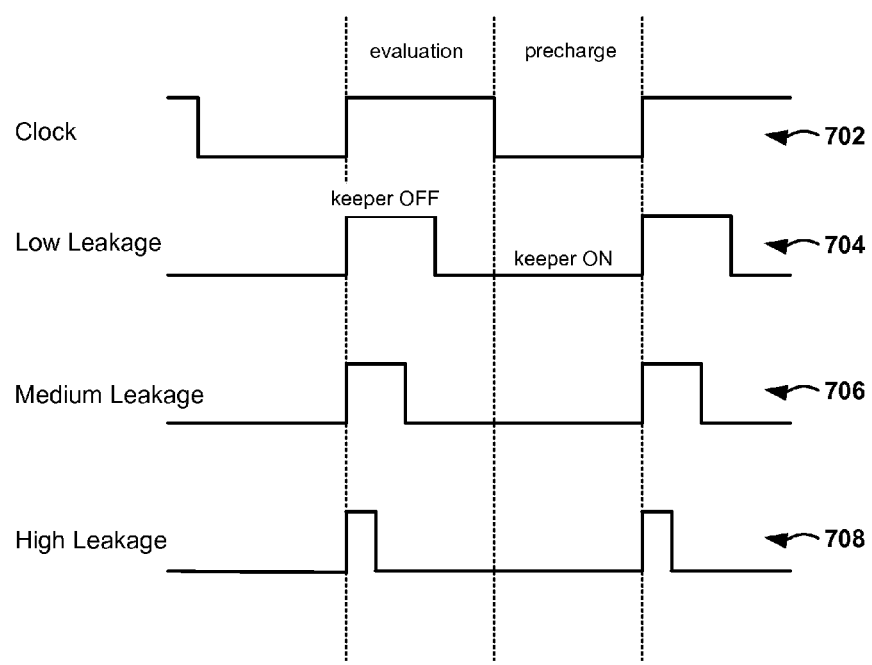
FIG. 7 illustrates the different waveforms for control signals according to the leakage in the leaker circuit, according to one embodiment.

FIG. 7 illustrates the different waveforms for control signals according to the leakage in the leaker circuit, according to one embodiment. A clock signal 702 includes an evaluation phase and a precharge phase, as discussed above. Depending on the amount of leakage in the leaker circuit, the shutoff window for the keeper circuit will be shorter or longer.

During low leakage 704, the keeper circuit is turned off a longer period of time that when there is medium or higher leakage, because the low leakage does not require as much the current supplied by the leaker circuit that compensates for the leakage in the NMOS writer circuit.

Figure 8:
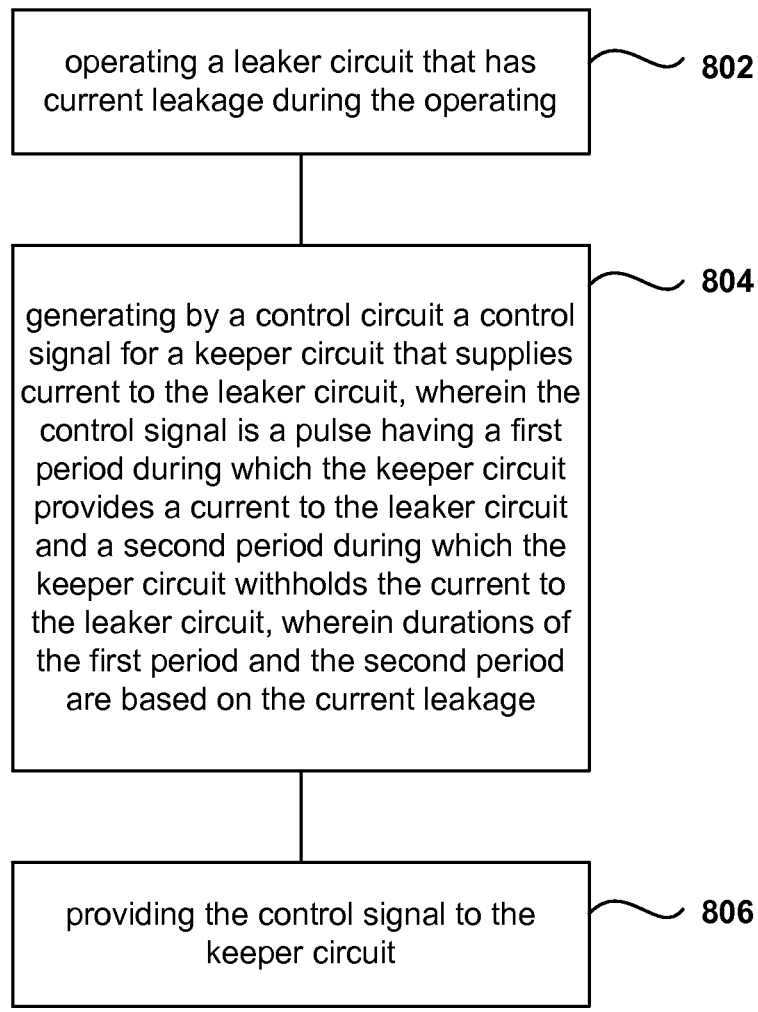
FIG. 8 shows a flowchart illustrating an algorithm for controlling circuit leakage, in accordance with one embodiment.

FIG. 8 shows a flowchart illustrating an algorithm for controlling circuit leakage, in accordance with one embodiment. In operation 802, a leaker circuit is operated (see for example the leaker circuit 102 of FIGS. 1 and 2). The leaker circuit experiments current leakage during the operation of the leaker circuit. From operation 802, the method flows to operation 804, where a control signal is generated by a control circuit (see for example kpr_ckl signal 422 of FIGS. 4A and 4B).

The control signal is for a keeper circuit (see for example keeper circuit 204 of FIG. 4A) that supplies current to the leaker circuit. Further, the control signal is a pulse (see polls 422 of FIG. 4B) having a first period during which the keeper circuit provides a current to the leaker circuit, and a second period during which the keeper circuit withholds the current to the leaker circuit.

The durations of the first period and the second period are based on the current leakage in the leaker circuit. From operation 804, the method flows to operation 806 where the control signal is provided to the keeper circuit.

Figure 9:
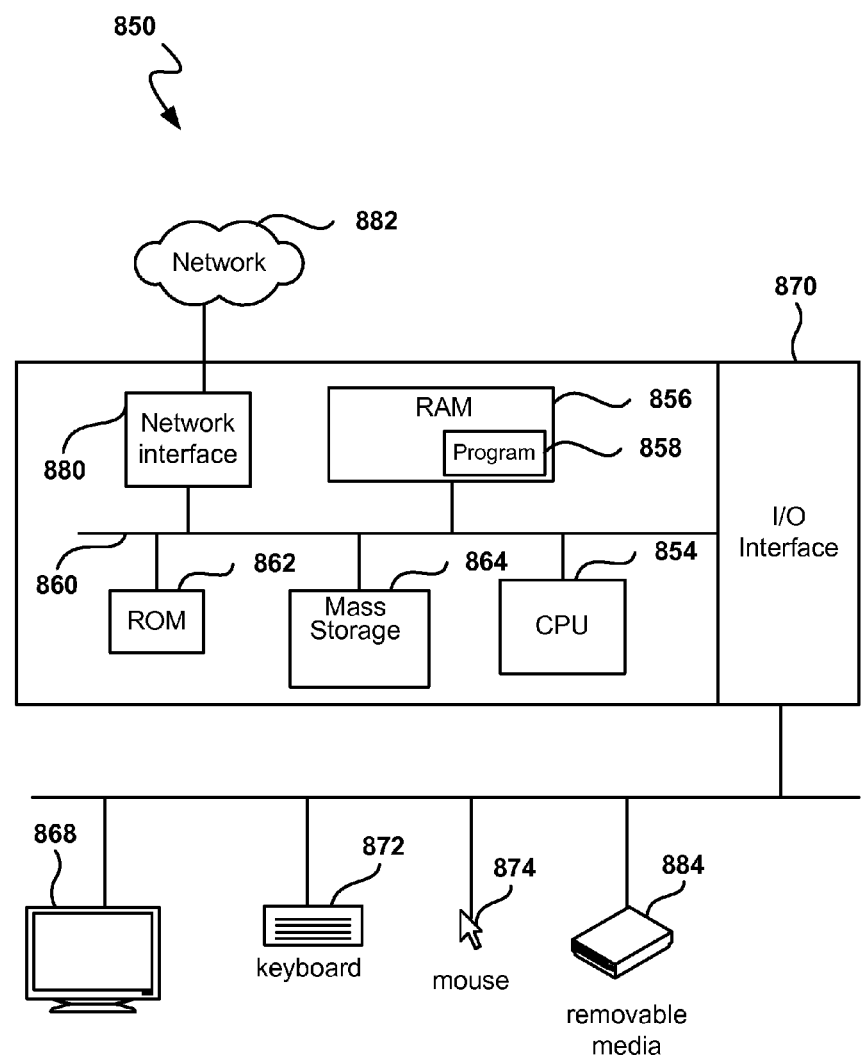
FIG. 9 is a simplified schematic diagram of a computer system for implementing embodiments described herein.

FIG. 9 is a simplified schematic diagram of a computer system for implementing embodiments described herein. FIG. 9 depicts an exemplary computer environment for implementing embodiments. It should be appreciated that the methods described herein may be performed with a digital processing system, such as a conventional, general-purpose computer system. Special purpose computers, which are designed or programmed to perform only one function, may be used in the alternative. The computer system includes a central processing unit (CPU) 1104, which is coupled through bus 1110 to random access memory (RAM) 1106, read-only memory (ROM) 1112, and mass storage device 1114. Computer program 1108 for searching related news articles resides in random access memory (RAM) 1106, but can also reside in mass storage 1114.

Mass storage device 1114 represents a persistent data storage device such as a floppy disc drive or a fixed disc drive, which may be local or remote. Network interface 1130 provides connections via network 1132, allowing communications with other devices. It should be appreciated that CPU 1104 may be embodied in a general-purpose processor, a special purpose processor, or a specially programmed logic device. Input/Output (I/O) interface provides communication with different peripherals and is connected with CPU 1104, RAM 1106, ROM 1112, and mass storage device 1114, through bus 1110. Sample peripherals include display 1118, keyboard 1122, cursor control 1124, removable media device 1134, etc.

Display 1118 is configured to display the user interfaces described herein. Keyboard 1122, cursor control 1124, removable media device 1134, and other peripherals are coupled to I/O interface 1120 in order to communicate information in command selections to CPU 1104. It should be appreciated that data to and from external devices may be communicated through I/O interface 1120. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A circuit comprising:
    a keeper circuit operable to supply current to a leaker circuit to compensate for a first current leakage in first NMOS transistors of the leaker circuit; and
    a controller operable to provide a control signal to the keeper circuit, wherein the control signal is based on the first current leakage in the leaker circuit, wherein the control signal is a pulse having a first value during a first period, a second value during a second period, and a duration of a clock cycle, wherein the keeper circuit provides a current to the leaker circuit during the first period and the keeper circuit withholds the current to the leaker circuit during the second period, wherein durations of the first period and the second period are based on the first current leakage, wherein the controller further includes a delay chain of inverters, the delay chain of inverters including:
  second NMOS transistors, wherein an increase of the first current leakage causes an increase in a second current leakage through the second NMOS transistors; and
  one or more second PMOS transistors operable to compensate for an increase in the second current leakage, wherein the one or more PMOS transistors are operable to determine a duration of the second period based on the second current leakage.

2. The circuit of claim 1, wherein one of the second PMOS transistors has a gate coupled to an output of a first inverter and a drain coupled to an input of the first inverter.

3. The circuit of claim 1, wherein the controller further includes a logical gate having inputs of a clock signal and an output of the delay chain of inverters.

4. The circuit of claim 1, wherein the keeper circuit includes a first PMOS transistor which enables or disables current passing from the keeper circuit to the leaker circuit, wherein a gate of the first PMOS transistor is coupled to an output of the controller outputting the control signal.

5. The circuit of claim 1, wherein the controller further includes a multiplexer, the multiplexer operable to select a number of delay gates in the delay chain.

6. A circuit comprising:
  a first circuit operable to supply current to a leaker circuit to compensate for a first current leakage in first NMOS transistors in the leaker circuit; and
  a second circuit coupled to the first circuit and operable to generate a control signal to the first circuit to compensate for the first current leakage, the second circuit including:
    second NMOS transistors, wherein an increase of the first current leakage through the first NMOS transistors causes an increase in a second current leakage through the second NMOS transistors; and
    one or more second PMOS transistors operable to compensate for an increase in the second current leakage, wherein the control signal is a pulse having a first value during a first period, a second value during a second period, wherein the first circuit provides a current to the leaker circuit during the first period and the first circuit withholds the current to the leaker circuit during the second period, wherein the one or more PMOS transistors are operable to determine a duration of the second period based on the second current leakage, wherein the second NMOS transistors and the one or more second PMOS transistors are defined in a delay chain of inverters.

7. The circuit of claim 6, wherein each inverter includes one or more of the second NMOS transistors and one or more third PMOS transistors.

8. The circuit of claim 6, wherein one of the second PMOS transistors has a gate coupled to an output of a first inverter and a drain coupled to an input of the first inverter.

9. The circuit of claim 6, wherein the second circuit further includes a logical gate having inputs of a clock signal and an output of the delay chain.

10. The circuit of claim 6, wherein the first circuit includes a first PMOS transistor which is operable to disable current passing from the first circuit to the leaker circuit, wherein a gate of the first PMOS transistor is operable to receive the control signal.

11. The circuit of claim 6, wherein the second circuit further includes a multiplexer, the multiplexer operable to select a number of delay gates in the first circuit.

12. A method for controlling circuit leakage, the method comprising:
  operating a leaker circuit with first NMOS transistors that have a first current leakage during the operating;
  generating by a control circuit a control signal for a keeper circuit that supplies current to the leaker circuit, wherein the control signal is a pulse having a first period during which the keeper circuit provides a current to the leaker circuit and a second period during which the keeper circuit withholds the current to the leaker circuit, wherein durations of the first period and the second period are based on the first current leakage, wherein the control circuit further includes a delay chain of inverters, the delay chain of inverters including:
    second NMOS transistors, wherein an increase of the first current leakage causes an increase in a second current leakage through the second NMOS transistors; and
    one or more second PMOS transistors operable to compensate for an increase in the second current leakage, wherein the one or more PMOS transistors are operable to determine a duration of the second period based on the second current leakage; and
  providing the control signal to the keeper circuit.

13. The method as recited in claim 12, wherein a duration of the second period decreases when the first current leakage increases.

14. The method as recited in claim 13, further including:
  regulating the duration of the second period with the second NMOS transistors and the one or more second PMOS transistors in the control circuit.

15. The method as recited in claim 12, wherein a duration of the second period increases when the first current leakage decreases.

16. The method as recited in claim 12, wherein the delay chain of inverters is operable to include a configurable number of delay gates, wherein the number of delay gates affects a duration of the second period.

17. The method as recited in claim 12, wherein the control signal has a duration equal to a duration of a cycle of a clock signal.

* * * * *

UNITED STATES PATENT AND TRADEMARK OFFICE
CERTIFICATE OF CORRECTION

PATENT NO. : 8,482,316 B1
APPLICATION NO. : 13/411493
DATED : July 9, 2013
INVENTOR(S) : Liu et al.

Page 1 of 1

It is certified that error appears in the above-identified patent and that said Letters Patent is hereby corrected as shown below:

In the Specification

In column 5, line 34, delete "writebility" and insert -- writability --, therefor.

In column 6, line 13, before "has" delete "that".

In column 8, line 22, delete "maybe" and insert -- may be --, therefor.

Signed and Sealed this
Fifteenth Day of October, 2013

Teresa Stanek Rea
*Deputy Director of the United States Patent and Trademark Office*